United States Patent
Hosokawa (10) Patent No.: US 8,854,053 B2
(45) Date of Patent: Oct. 7, 2014

(54) APPARATUS AND METHOD FOR ANALYZING THE STATE OF OIL-FILLED ELECTRICAL DEVICES

(75) Inventor: Noboru Hosokawa, Chiyoda-ku (JP)

(73) Assignee: Mitsubishi Electronics Corporation, Chiyoda-Ku, Tokyo (JP)

(*) Notice: Subject to any disclaimer, the term of this patent is extended or adjusted under 35 U.S.C. 154(b) by 610 days.

(21) Appl. No.: 13/142,647

(22) PCT Filed: Mar. 31, 2010

(86) PCT No.: PCT/JP2010/055813
§ 371 (c)(1),
(2), (4) Date: Jun. 29, 2011

(87) PCT Pub. No.: WO2010/116931
PCT Pub. Date: Oct. 14, 2010

(65) Prior Publication Data
US 2011/0291674 A1    Dec. 1, 2011

(30) Foreign Application Priority Data

Apr. 7, 2009  (WO) .................. PCT/JP2009/057117

(51) Int. Cl.
| | | |
|---|---|---|
| G01R 27/26 | (2006.01) | |
| G01R 31/12 | (2006.01) | |
| G01R 31/02 | (2006.01) | |
| G01R 31/16 | (2006.01) | |
| H01F 27/14 | (2006.01) | |
| H01F 27/40 | (2006.01) | |

(52) U.S. Cl.
CPC .............. *H01F 27/402* (2013.01); *G01R 31/12* (2013.01); *G01R 31/027* (2013.01); *H01F 27/14* (2013.01); *G01R 31/16* (2013.01); *H01F 2027/404* (2013.01)
USPC ........... 324/658; 324/519; 324/522; 324/509; 324/533

(58) Field of Classification Search
CPC .......... G01N 33/2841; G01N 33/2835; G01N 33/287; G01R 27/26; H01F 27/14; H01F 27/23; H01F 27/402
USPC ........ 324/509, 533, 536, 537, 541, 544, 551, 324/558, 519, 522, 658
See application file for complete search history.

(56) References Cited

U.S. PATENT DOCUMENTS

2010/0109686 A1* 5/2010 Zhe et al. ................ 324/698

FOREIGN PATENT DOCUMENTS

| JP | 59-006721 A | 1/1984 |
| JP | 61-188326 U | 11/1986 |

(Continued)

OTHER PUBLICATIONS

International Search Report (PCT/ISA/210) for PCT/JP2010/055813 dated Jun. 15, 2010.

*Primary Examiner* — Arleen M Vazquez
*Assistant Examiner* — Son Le
(74) *Attorney, Agent, or Firm* — Buchanan Ingersoll & Rooney PC (57) ABSTRACT

Provided is an apparatus for analyzing the state of oil-filled electrical devices. The apparatus simulates the state of an oil-filled electrical device in which copper wire wrapped in insulating paper is immersed in insulating oil. The apparatus for analyzing the state of oil-filled electrical devices includes a first paper-covered copper wire and a second paper-covered copper wire, which are adjacent to each other; a tank which holds the first and second paper-covered copper wires as well as insulating oil extracted from the oil-filled electrical device, thereby immersing the first and second paper-covered copper wires in the insulating oil; and a capacitance measurement unit which measures the capacitance between the first and second paper-covered copper wires. The first and second paper-covered copper wires includes copper wire and insulating paper wrapped therearound. The insulating paper wrapper around each copper wire includes the same material as the insulating paper in the oil-filled electrical device.

16 Claims, 9 Drawing Sheets

(56) References Cited

FOREIGN PATENT DOCUMENTS

| JP | 02-103910 A | 4/1990 |
| JP | 2-154162 A | 6/1990 |
| JP | 04-176108 A | 6/1992 |
| JP | 04-252945 A | 9/1992 |
| JP | 2000-353623 A | 12/2000 |
| JP | 2003-289008 A | 10/2003 |
| JP | 2003289008 A * 10/2003 | ............. H01F 27/00 |
| JP | 2010-027908 A | 2/2010 |

* cited by examiner

APPARATUS AND METHOD FOR ANALYZING THE STATE OF OIL-FILLED ELECTRICAL DEVICES

TECHNICAL FIELD

The present invention relates to apparatus and method of analyzing state of electrical devices and, more specifically, to apparatus and method of analyzing the state of oil-filled electrical devices such as a transformer and a reactor.

BACKGROUND ART

Insulating oil used in an oil-filled electrical device such as a transformer or a reactor may contain traces of elemental sulfur and sulfur compound that are corrosive. Corrosive sulfur reacts with metal such as copper wire coil that is susceptible to sulfuration used in the oil-filled electrical device and generates conductive sulfide. There are many reports that such conductive sulfide causes malfunction of oil-filled electrical devices. The mechanism how the sulfide is generated is not fully clarified, and what is found to date is simply that the mechanism depends on the temperature and the type of insulating oil.

As a method of diagnosing sulfide in an oil-filled electrical device, Japanese Patent Laying-Open No. 4-176108 (Patent Literature 1) discloses the following configuration. Specifically, in the oil-filled electrical machinery, a detecting part having metal particles dispersed on a surface is provided in contact with insulating oil of the oil-filled electrical machinery, and change in electric resistance of the detecting part is found. The metal particles dispersed on the surface of detecting part are combined with elemental sulfur and sulfur compound in the insulating oil, so that conductive sulfide is generated at the surface of the detecting part. This leads to a change in electric resistance of the detecting part and, therefore, by finding the change in electric resistance, it is possible to know the degree of sulfide generation.

Japanese Patent Laying-Open No. 59-6721 (Patent Literature 2) discloses the following configuration. Specifically, in an oil-filled electrical device including an oil-filled electrical device tank containing a main body of the electrical device and insulating oil and a cooling device coupled via an oil pipe so that the insulating oil is circulated, an oil reservoir is provided in insulating oil circulating system, that is, in the body tank of the oil-filled electrical device, in the cooler or in the middle of the oil pipe. In the oil reservoir, a sensitive medium that reacts with active sulfur in the insulating oil is provided, and substance deposited on a surface of the sensitive medium is detected by a sensor including a light-emitting photoelectric device and a photoreceptor. Further, a display device is provided, which receives a signal output from the sensor as its input.

Further, Japanese Patent Laying-Open No. 2-103910 (Patent Literature 3) discloses the following configuration. Specifically, in an electrical device having a main body fixed in a tank filled with insulating oil, a sample storage box is provided, through which the insulating oil in the tank circulates. A conductor sample having the same metal as the conductor of device main body as a main component is placed in the sample storage box. Thus, the conductor sample in the sample storage box comes to be subjected to the same conditions of sulfide corrosion as the conductor of device main body in the tank. Therefore, by monitoring the conductor sample, it is possible to monitor the development of sulfide corrosion of the device main body.

Japanese Patent Laying-Open No. 4-252945 (Patent Literature 4) discloses the following configuration. Specifically, a moisture-in-oil monitor of an oil-filled electrical device is for monitoring moisture in insulating oil of an electrical device having a device main body placed in an oil tank filled with the insulating oil, and it includes: a moisture-in-oil sensor formed of an insulating paper placed between dielectric characteristic measuring electrodes, whose dielectric characteristic changes depending on moisture equilibrium with the insulating oil; a sensor container provided outside of the oil tank, housing the moisture-in-oil sensor, and filled with the insulating oil; a first communication pipe inserted between the sensor container and the oil tank, through which the insulating oil in the sensor container and in the oil tank flow; a first communication valve provided at an end or in the middle of the communication pipe for opening/closing the communication of insulating oil; and a dielectric characteristic monitor part connected to the measuring electrodes of the moisture-in-oil sensor, converting a dielectric characteristic value of the insulating paper to an amount of moisture in oil and, if the amount of moisture in the insulating oil exceeds a reference value, determining occurrence of a malfunction and outputting an alarm signal.

CITATION LIST

Patent Literature

PTL 1: Japanese Patent Laying-Open No. 4-176108
PTL 2: Japanese Patent Laying-Open No. 59-6721
PTL 3: Japanese Patent Laying-Open No. 2-103910
PTL 4: Japanese Patent Laying-Open No. 4-252945

SUMMARY OF INVENTION

Technical Problem

Since sulfide corrosion test of immersing a copper plate in insulating oil, measuring color change of the copper plate and selecting the insulating oil has been defined, the problem caused by generation of copper sulfide in insulating oil of oil-filled electrical devices has been subsided. Recently, however, a problem of copper sulfide generated on insulating paper wrapped around a copper wire coil causing malfunction of oil-filled electrical devices has been observed, even though the insulating oil that passed the sulfide corrosion test is used.

Specifically, if copper sulfide is generated on the insulating paper on a copper wire coil in an oil-filled electrical device, dielectric strength between the copper wire coils decreases. The dielectric strength most significantly lowers due to the generation of copper sulfide and, therefore, it is important to detect beforehand the generation of copper sulfide between copper wire coils.

The methods disclosed in Patent Literatures 1 and 2 are methods of diagnosing generation of sulfide in oil-filled electrical devices by providing a member that reacts with active sulfur in the insulating oil and comes to have sulfide generated thereon, and by detecting a change in characteristic of the member. Therefore, it is difficult to accurately grasp the change in characteristic caused by the generation of sulfide in the actual oil-filled electrical devices.

Patent Literature 3 discloses a method of diagnosing generation of sulfide by visual monitoring of the conductor sample immersed in the insulating oil, or a method of analyzing the conductor sample taken out from the storage box. Here, the copper wire coil wrapped by insulating paper is not used, and a specific method of accurately detecting generation of sulfide in the oil-filled electrical device is not disclosed.

Patent Literature 4 discloses a method of monitoring moisture in insulating oil, while it does not disclose the method of detecting generation of sulfide in the insulating oil.

The present invention was made to solve the problem described above, and its object is to provide method and apparatus capable of accurately detecting generation of sulfide in oil-filled electrical devices in which copper wires wrapped with insulating paper is immersed in the insulating oil.

Solution to Problem

In order to solve the above-described problem, according to an aspect, the present invention provides an apparatus for analyzing a state of an oil-filled electrical device that simulates a state of an oil-filled electrical device having a copper wire wrapped with insulating paper immersed in insulating oil, including a first paper-covered copper wire. The first paper-covered copper wire includes a first copper wire and first insulating paper wrapped around the first copper wire. The first insulating paper is formed of the same material as the insulating paper held in the oil-filled electrical device. The apparatus for analyzing the state of oil-filled electrical device further includes an electrode, a tank for immersing the first paper-covered copper wire and the electrode in the insulating oil extracted from the oil-filled electrical device, and a capacitance measuring unit. The electrode is arranged adjacent to the first paper-covered copper wire. The tank contains the first paper-covered copper wire, the electrode and the insulating oil extracted from the oil-filled electrical device. The capacitance measuring unit is for measuring electrostatic capacitance between the first paper-covered copper wire and the electrode.

According to another aspect, the present invention provides an apparatus for analyzing a state of an oil-filled electrical device that simulates a state of an oil-filled electrical device having a copper wire wrapped with insulating paper immersed in insulating oil, including a first paper-covered copper wire. The first paper-covered copper wire includes a first copper wire and first insulating paper wrapped around the first copper wire. The first insulating paper is formed of the same material as the insulating paper held in the oil-filled electrical device. The apparatus for analyzing the state of oil-filled electrical device further includes an electrode, a tank for immersing the first paper-covered copper wire and the electrode in the insulating oil extracted from the oil-filled electrical device, a power source and a current measuring unit. The electrode is arranged adjacent to the first paper-covered copper wire. The tank contains the first paper-covered copper wire, the electrode and the insulating oil extracted from the oil-filled electrical device. The power source applies an AC voltage across the first paper-covered copper wire and the electrode. The current measuring unit measures the current flowing across the first paper-covered copper wire and the electrode.

In order to solve the above-described problem, the present invention provides a method of analyzing a state of an oil-filled electrical device simulating a state of an oil-filled electrical device having a copper wire wrapped with insulating paper immersed in insulating oil, including the step of putting the insulating oil extracted from the oil-filled electrical device, a first paper-covered copper wire including a first copper wire and first insulating paper wrapped around the first copper wire, and an electrode arranged adjacent to the first paper-covered copper wire in a tank, such that the first paper-covered copper wire and the electrode are immersed in the insulating oil. The first insulating paper is formed of the same material as the insulating paper held in the oil-filled electrical device. The method further includes the step of measuring electrostatic capacitance between the first paper-covered copper wire and the electrode contained in the tank.

According to a still further aspect, the present invention provides a method of analyzing a state of an oil-filled electrical device simulating a state of an oil-filled electrical device having a copper wire wrapped with insulating paper immersed in insulating oil, including the step of putting the insulating oil extracted from the oil-filled electrical device, a first paper-covered copper wire including a first copper wire and first insulating paper wrapped around the first copper wire, and an electrode arranged adjacent to the first paper-covered copper wire in a tank, such that the first paper-covered copper wire and the electrode are immersed in the insulating oil. The first insulating paper is formed of the same material as the insulating paper held in the oil-filled electrical device. The method further includes the step of measuring a current flowing across the first paper-covered copper wire and the electrode by applying an AC voltage across the first paper-covered copper wire and the electrode contained in the tank.

Advantageous Effects of Invention

According to the present invention, it is possible to accurately detect generation of sulfide in an oil-filled electrical device having a copper wire wrapped with insulating paper immersed in insulating oil.

DESCRIPTION OF EMBODIMENTS

In the following, embodiments of the present invention will be described with reference to the figures. In the figures, the same or corresponding portions are denoted by the same reference characters, and description thereof will not be repeated.

First Embodiment

[Configuration and Basic Operation]

Figure 1:
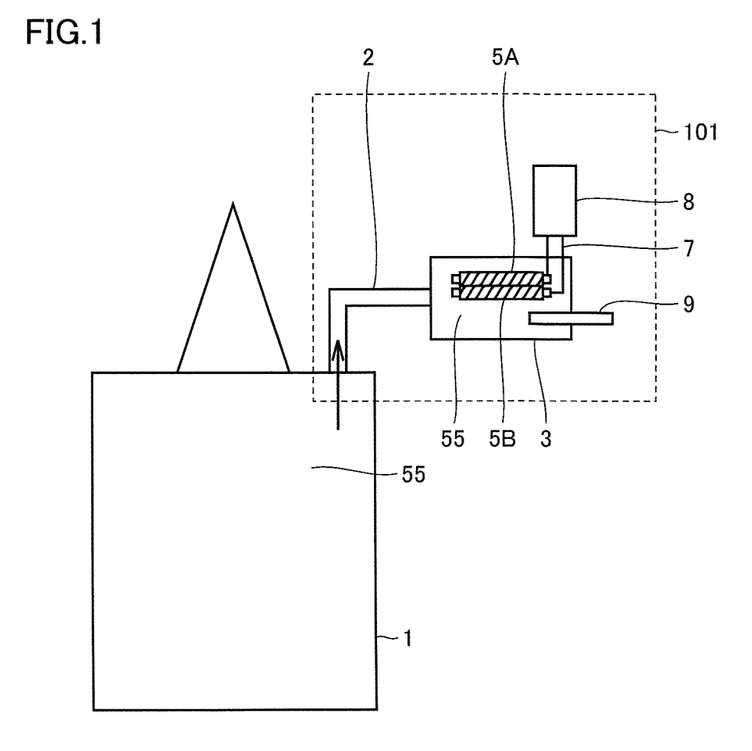
FIG. 1 shows a configuration of an apparatus for analyzing state of oil-filled electrical device in accordance with a first embodiment of the present invention.

FIG. 1 shows a configuration of an apparatus for analyzing state of oil-filled electrical device in accordance with the first embodiment of the present invention.

Referring to FIG. 1, an apparatus 101 for analyzing the status of oil-filled electrical device includes a pipe 2, a tank 3, paper-covered copper wires 5A and 5B, a measuring line 7, a capacitance measuring instrument (capacitance measuring unit) 8, and an oil temperature regulator (temperature regulating unit) 9.

Figure 2:
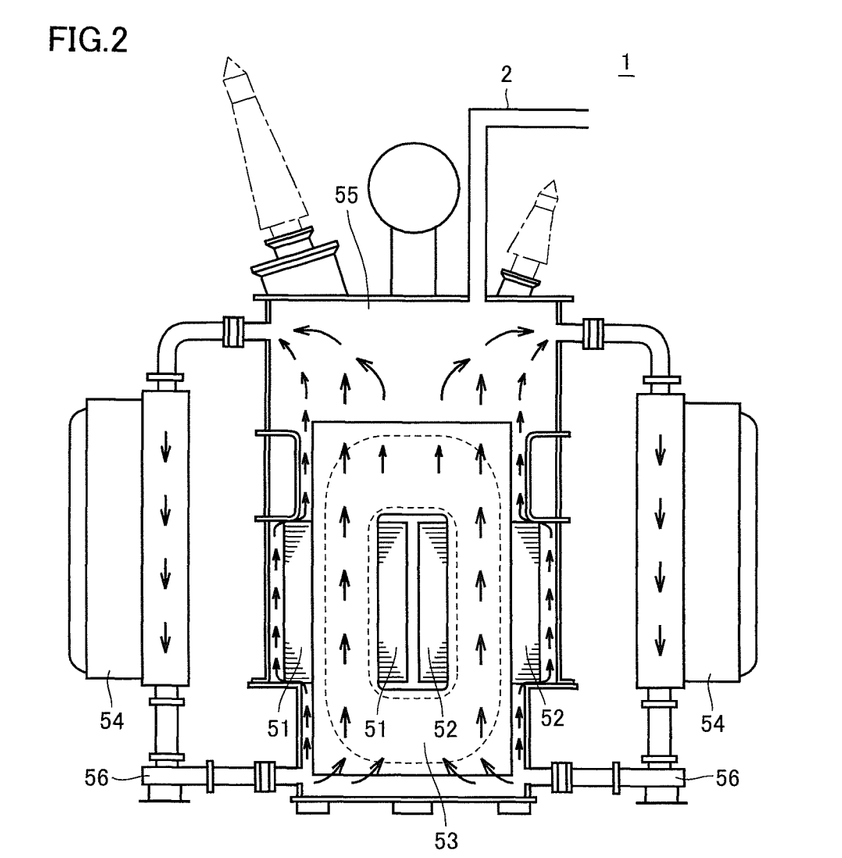
FIG. 2 is a cross-sectional view showing a configuration of the oil-filled electrical device.

FIG. 2 is a cross-sectional view showing a configuration of the oil-filled electrical device.

Referring to FIG. 2, oil-filled electrical device 1 is, for example, an electric transformer, including iron cores 51 and 52, a coil 53, a cooler 54, insulating oil 55 and a pump 56.

Coil 53 is a paper-covered copper wire formed of copper wire wrapped with insulating paper. Coil 53 is surrounded by iron cores 51 and 52.

Oil-filled electrical device 1 is filled with insulating oil 55, and coil 53 is immersed in insulating oil 55. Insulating oil 55 insulates and cools oil-filled electrical device 1. Cooler 54 cools insulating oil 55.

Pump 56 circulates insulating oil 55 in oil-filled electrical device 1 as indicated by the arrows in the figure, to cool coil 53.

Further, oil-filled electrical device 1 and tank 3 are connected by pipe 2, and insulating oil 55 in oil-filled electrical device 1 can be extracted while the device is in operation.

Figure 3:
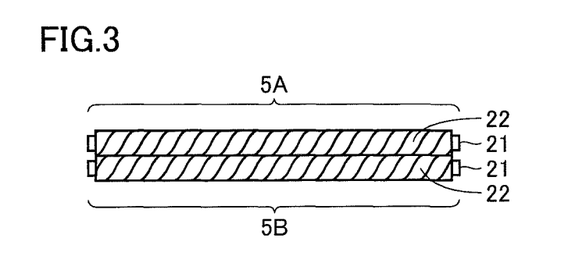
FIG. 3 shows a configuration of paper-covered copper wires 5A and 5B in the apparatus for analyzing state of oil-filled electrical device in accordance with the first embodiment of the present invention.

FIG. 3 shows a configuration of paper-covered copper wires 5A and 5B in the apparatus for analyzing state of oil-filled electrical device in accordance with the first embodiment of the present invention.

Referring to FIG. 3, each of paper-covered copper wires 5A and 5B include a copper wire 21 and insulating paper 22. Copper wire 21 is wrapped with insulating paper 22 of the same material as the insulating paper of coil 53. Further, copper wire 21 is formed, for example, by the same material as the conductor of coil 53. Paper-covered copper wires 5A and 5B are provided in tight contact with each other. Specifically, copper wire 21 of paper-covered copper wire 5A and copper wire 21 of paper-covered copper wire 5B are provided adjacent to each other. Paper-covered copper wires 5A and 5B are provided for simulating coil 53 in oil-filled electrical device 1 that is in operation.

Again referring to FIG. 1, tank 3 contains paper-covered copper wires 5A and 5B and insulating oil 55 extracted through pipe 2. Since tank 3 contains paper-covered copper wires 5A and 5B and insulating oil 55 extracted through pipe 2, paper-covered copper wires 5A and 5B can be immersed in insulating oil 55.

Oil temperature regulator 9 generates heat and regulates temperature of insulating oil 55 in tank 3. By way of example, oil temperature regulator 9 controls the temperature of insulating oil 55 in tank 3 such that the temperature of insulating oil 55 in tank 3 becomes higher than the temperature of insulating oil 55 in oil-filled electrical device 1.

Measuring line 7 is drawn out from each copper wire 21 of paper-covered copper wires 5A and 5B, and measuring line 7 is connected to capacitance measuring instrument 8. Capacitance measuring instrument 8 measures electrostatic capacitance of paper-covered copper wires 5A and 5B through measuring line 7.

[Operation]

Next, an operation of diagnosing the oil-filled electrical device using the apparatus for analyzing the state of oil-filled electrical device in accordance with the first embodiment of the present invention will be described.

Figure 4:
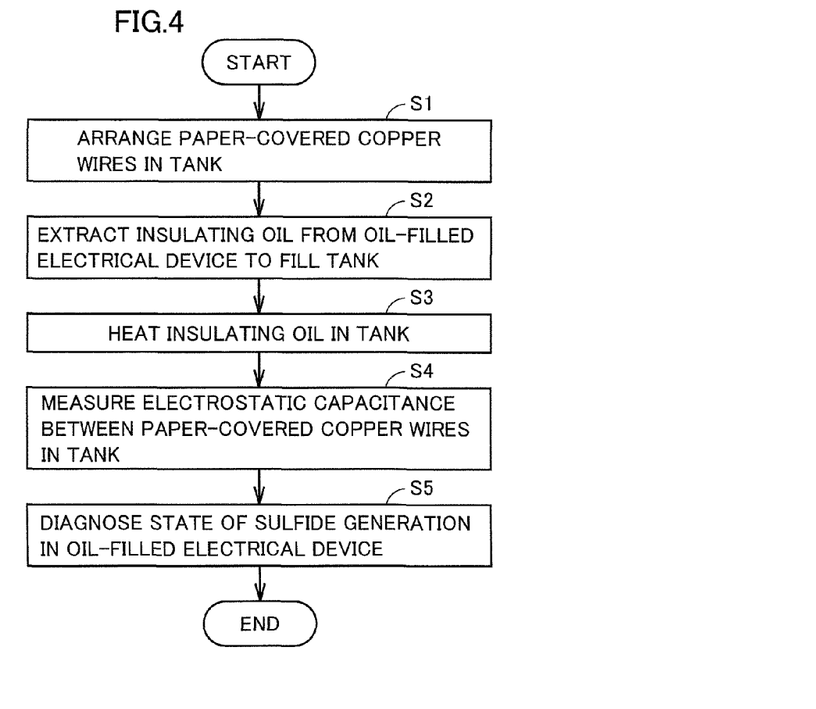
FIG. 4 is a flowchart defining the operation procedure for diagnosing the oil-filled electrical device using the apparatus for analyzing state of oil-filled electrical device in accordance with the first embodiment of the present invention.

FIG. 4 is a flowchart defining the operation procedure for diagnosing the oil-filled electrical device using the apparatus for analyzing state of oil-filled electrical device in accordance with the first embodiment of the present invention.

Referring to FIG. 4, first, paper-covered copper wires 5A and 5B are placed in tank 3 (step S1).

Thereafter, insulating oil 55 is extracted from oil-filled electrical device 1 through pipe 2, and tank 3 is filled with insulating oil 55 (step S2). Thus, paper-covered copper wires 5A and 5B are immersed in insulating oil 55.

Next, to conduct an accelerated deterioration test, insulating oil 55 in tank 3 is heated by oil temperature regulator 9, so that the temperature of insulating oil in tank 3 is made higher than the temperature of insulating oil 55 in oil-filled electrical device 1 (step S3).

Next, using capacitance measuring instrument 8, electrostatic capacitance between paper-covered copper wires 5A and 5B in tank 3 is measured (step S4).

Next, based on the result of capacitance measurement, the state of sulfide generation in oil-filled electrical device 1 is examined and analyzed (step S5).

Figure 5:
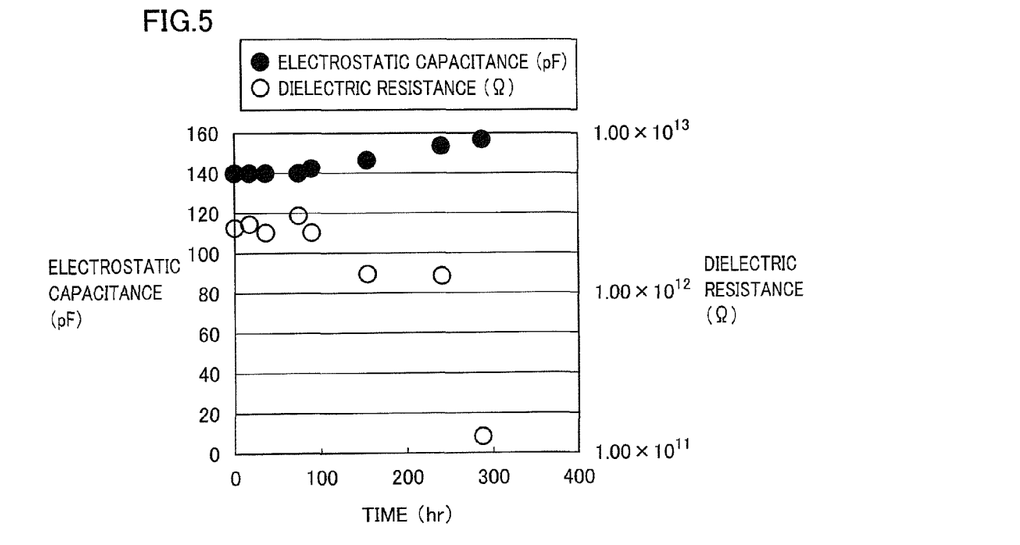
FIG. 5 shows the results of diagnosis of the oil-filled electrical device diagnosed using the apparatus for analyzing state of oil-filled electrical device in accordance with the first embodiment of the present invention.
Figure 6:
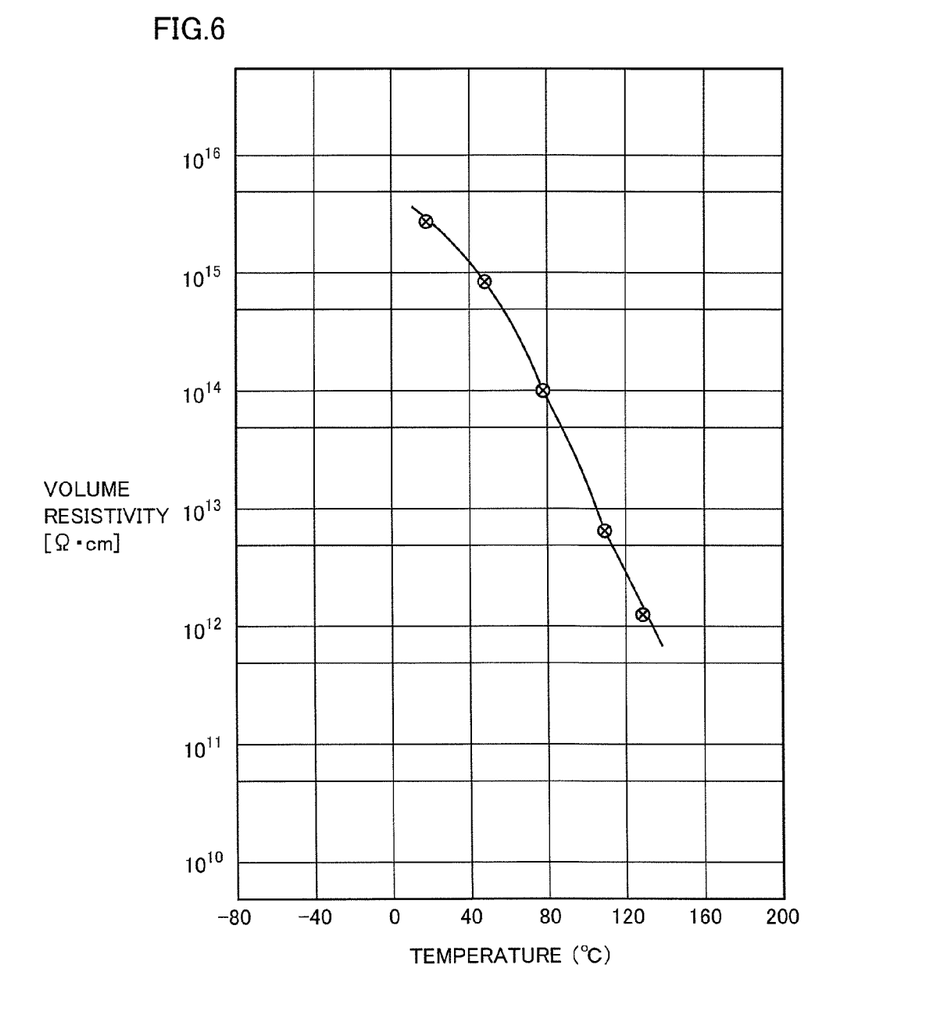
FIG. 6 shows temperature characteristic of volume resistivity of insulating paper immersed in insulating oil.
Figure 7:
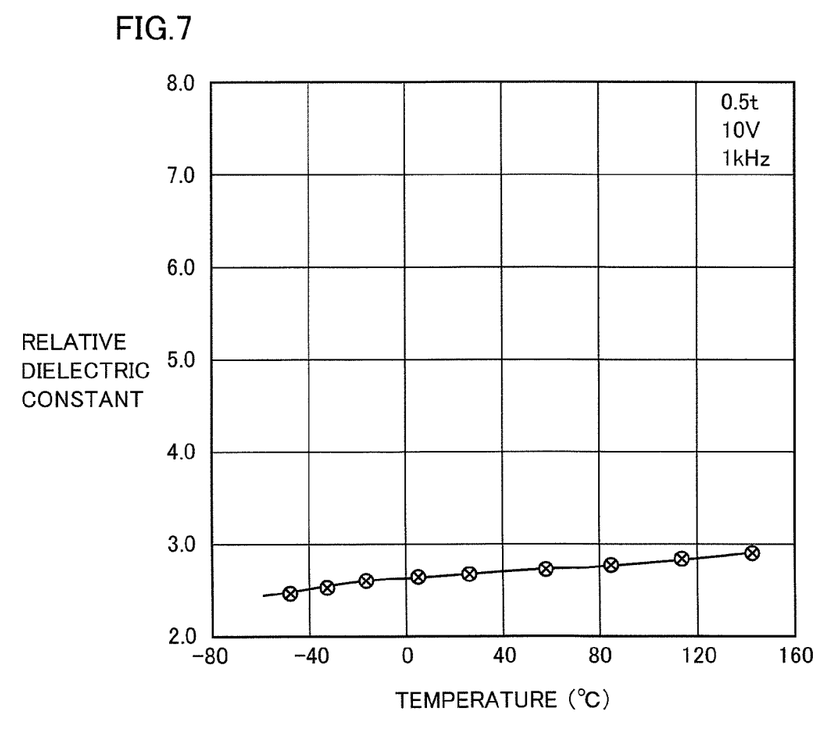
FIG. 7 shows temperature characteristic of relative dielectric constant of the insulating paper immersed in insulating oil.

FIG. 5 shows the results of diagnosis of the oil-filled electrical device diagnosed using the apparatus for analyzing state of oil-filled electrical device in accordance with the first embodiment of the present invention. FIG. 5 shows time-change of electrostatic capacitance between paper-covered copper wires and dielectric resistance having direct influence on the insulating characteristic between paper-covered copper wires. FIG. 6 shows temperature characteristic of volume resistivity of insulating paper immersed in insulating oil. FIG. 7 shows temperature characteristic of relative dielectric constant of the insulating paper immersed in insulating oil.

Here, the accelerated deterioration test was conducted at a high temperature of 130° C., using one type of insulating oil that passed the afore-mentioned sulfide corrosion test but generated copper sulfide on the insulating paper.

Referring to FIG. 5, substantially linear increase of electrostatic capacitance was observed after about 90 hr (hours) from the start of heating.

On the other hand, dielectric resistance hardly changed at about 90 hr after the start of heating, slightly lowered at about 150 hr after the start of heating, and significantly lowered after about 300 hr.

The reason may be as follows. At the initial state of copper sulfide generation at about 90 hr, even if copper sulfide should be formed on the insulating paper between paper-covered copper wires, resistance of the insulating layer attained by the insulating paper is dominant and, therefore, dielectric resistance between paper-covered copper wires is not much influenced. On the other hand, the insulating distance of insulating paper between the paper-covered copper wires, which is typically in the order of mm, becomes shorter by the thickness of the copper sulfide layer in the order of 10 μm and, therefore, the electrostatic capacitance increases in the order of percentage.

Here, referring to FIG. 6, the volume resistivity of insulating paper immersed in the insulating oil varies significantly depending on temperature. Therefore, the dielectric resistance between paper-covered copper wires changes widely with temperature. By way of example, if oil-filled electrical device 1 is used outdoors, the dielectric resistance between paper-covered copper wires varies widely in accordance with the temperature change of the day. Considering such temperature characteristic, it is difficult to determine that copper sulfide has been generated, simply from the decrease of dielectric resistance at about 150 hr as shown in FIG. 5.

Referring to FIG. 7, the relative dielectric constant of insulating paper immersed in the insulating oil hardly changes with temperature. Therefore, electrostatic capacitance between paper-covered copper wires hardly changes with temperature. Therefore, it is possible to determine that copper sulfide has been generated, from the fact that electrostatic capacitance increased at about 90 hr from the start of heating as shown in FIG. 5.

Therefore, by measuring the electrostatic capacitance between paper-covered copper wires, it is possible to accurately detect whether copper sulfide has been generated or not, even in the initial state of copper sulfide generation. Specifically, after about 150 hr at which the electrostatic capacitance increased by about 10% from the initial value of about 140 pF at 0 hr, undesirable influence was observed on the insulating characteristic. According to the first embodiment of the present invention, increase in the electrostatic capacitance can be detected at the time point of about 90 hr and, therefore, it can be understood that generation of copper sulfide can be detected before the insulating characteristic starts to deteriorate.

The methods described in Patent Literatures 1 to 4 had the problem that accurate detection of sulfide generation in the insulating oil was difficult. In the method of Patent Literature 4, resistance of the insulating oil is measured by measuring the moisture in insulating oil. Variation of the moisture in insulating oil, however, is not correlated with generation of copper sulfide. Therefore, it is difficult to accurately detect generation of sulfide in the insulating oil.

In contrast, the apparatus for analyzing the state of oil-filled electrical device in accordance with the first embodiment of the present invention includes tank 3 for immersing wire-covered copper wires 5A and 5B in insulating oil, and capacitance measuring instrument 8 for measuring electrostatic capacitance between paper-covered copper wires 5A and 5B. Tank 3 houses paper-covered copper wires 5A and 5B, and contains insulating oil 55 extracted from oil-filled electrical device 1.

Because of such a configuration, it becomes possible to simulate the same material conditions as oil-filled electrical device 1 and, therefore, the state of generation of sulfide in oil-filled electrical device 1 can accurately be simulated and diagnosed without disassembling or suspending the operation of oil-filled electrical device 1 that is in operation. Therefore, it becomes possible to make longer the life of oil-filled electrical device 1 and to prevent troubles caused by malfunction of oil-filled electrical device 1. Further, since the electrostatic capacitance between paper-covered copper wires is measured, it is possible to detect with high sensitivity the generation of copper sulfide on the paper-covered copper wires before insulating characteristic starts to deteriorate.

Therefore, by the apparatus and method of analyzing the state of oil-filled electrical device in accordance with the first embodiment of the present invention, it is possible to accurately detect generation of copper sulfide in the oil-filled electrical device having copper wires wrapped with insulating paper immersed in the insulating oil.

Further, in the first embodiment of the present invention, insulating oil 55 is extracted from oil-filled electrical device 1 through pipe 2 connecting oil-filled electrical device 1 and tank 3, and the oil is introduced to tank 3. Therefore, it becomes possible to constantly monitor the generation of copper sulfide in oil-filled electrical device 1.

Further, in the first embodiment of the present invention, since insulating oil 55 contained in tank 3 is heated by using oil temperature regulator 9, it is possible to make higher the temperature of insulating oil 55 than the temperature in oil-filled electrical device 1 and thereby to realize accelerated deterioration. Specifically, by promoting earlier generation of copper sulfide than in oil-filled electrical device 1, simulation and diagnosis of oil-filled electrical device under the conditions of accelerated sulfide generation becomes possible. More specifically, since sulfide can be generated in apparatus 101 for analyzing the state of oil-filled electrical device before sulfide is generated in oil-filled electrical device 1, it becomes possible to see the state of deterioration of oil-filled electrical device 1 at a still earlier stage. Therefore, troubles caused by malfunction of oil-filled electrical device can more reliably be prevented and long-time reliability of oil-filled electrical device can be improved.

Though paper-covered copper wires 5A and 5B are placed in tank 3 and thereafter tank 3 is filled with insulating oil 55 in the first embodiment of the present invention, the procedure is not limited to the above. What is necessary is to have insulating oil 55 extracted from oil-filled electrical device 1 and paper-covered copper wires 5A and 5B contained in tank 3. Therefore, by way of example, tank 3 may be first filled with insulating oil 55 and then paper-covered copper wires 5A and 5B may be placed in tank 3.

Next, other embodiments of the present invention will be described with reference to the figures. In the figures, the same or corresponding portions are denoted by the same reference characters and description thereof will not be repeated.

Second Embodiment

The present embodiment relates to an apparatus for analyzing the state of oil-filled electrical device in which the method of detecting copper sulfide is different from that in the apparatus for analyzing the state of oil-filled electrical device in accordance with the first embodiment. Except for the points described in the following, the apparatus is the same as the apparatus for analyzing the state of oil-filled electrical device in accordance with the first embodiment.

Figure 8:
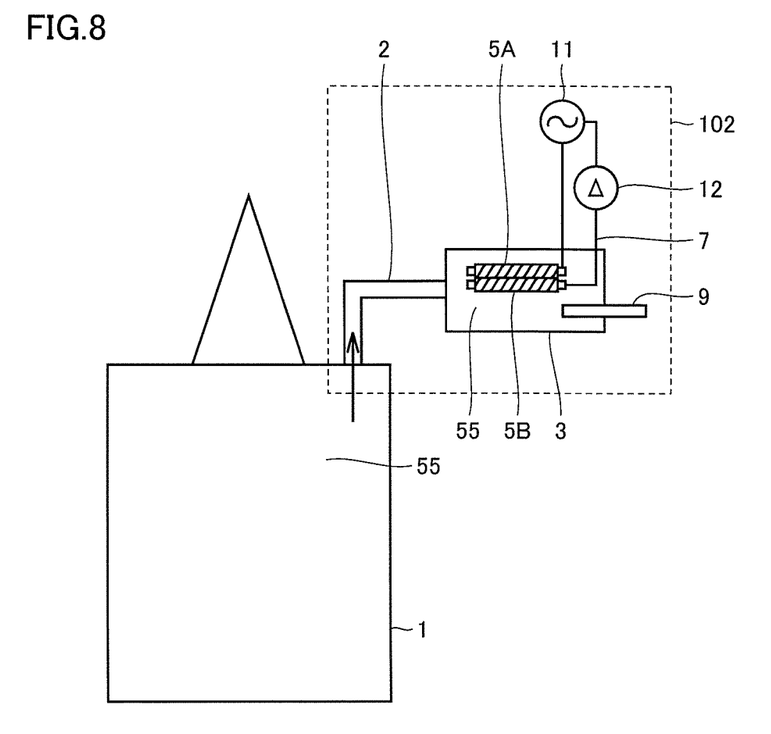
FIG. 8 shows a configuration of an apparatus for analyzing state of oil-filled electrical device in accordance with a second embodiment of the present invention.

FIG. 8 shows a configuration of an apparatus for analyzing state of oil-filled electrical device in accordance with the second embodiment of the present invention.

Referring to FIG. 8, an apparatus 102 for analyzing the state of oil-filled electrical device includes pipe 2, tank 3, paper-covered copper wires 5A and 5B, measuring line 7, an AC source 11, and an ammeter (current measuring unit) 12. Specifically, as compared with apparatus 101 for analyzing the state of oil-filled electrical device, apparatus 102 for analyzing the state of oil-filled electrical device includes AC source 11 and ammeter 12 in place of capacitance measuring instrument 8.

AC source 11 applies an AC voltage between paper-covered copper wires 5A and 5B. Ammeter 12 measures the current flowing across paper-covered copper wires 5A and 5B.

Figure 9:
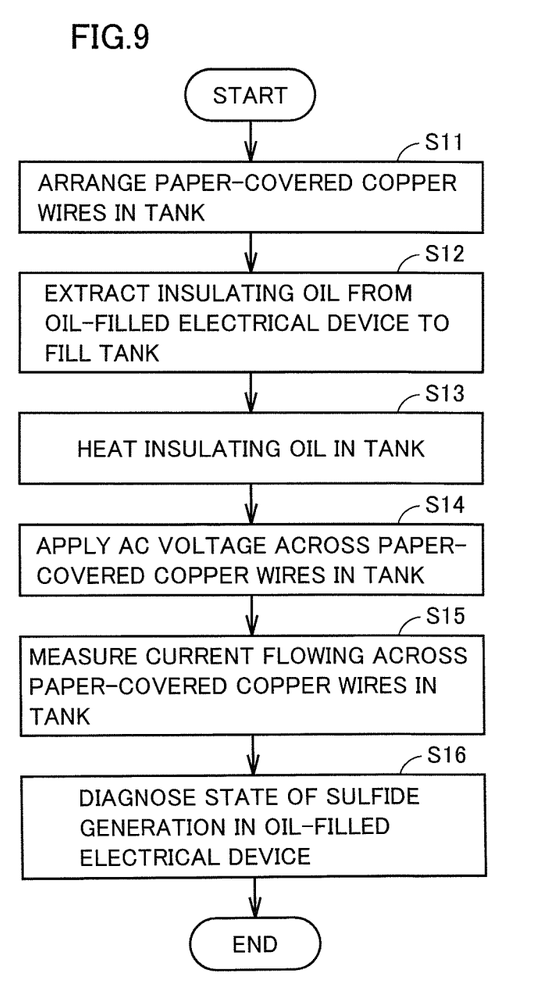
FIG. 9 is a flowchart defining the operation procedure for diagnosing the oil-filled electrical device using the apparatus for analyzing state of oil-filled electrical device in accordance with the second embodiment of the present invention.

FIG. 9 is a flowchart defining the operation procedure for diagnosing the oil-filled electrical device using the apparatus for analyzing state of oil-filled electrical device in accordance with the second embodiment of the present invention.

Referring to FIG. 9, first, paper-covered copper wires 5A and 5B are placed in tank 3 (step S11).

Thereafter, insulating oil 55 is extracted from oil-filled electrical device 1 through pipe 2, and tank 3 is filled with insulating oil 55 (step S12). Thus, paper-covered copper wires 5A and 5B are immersed in insulating oil 55.

Next, to conduct an accelerated deterioration test, insulating oil 55 in tank 3 is heated by oil temperature regulator 9, so that the temperature of insulating oil in tank 3 is made higher than the temperature of insulating oil 55 in oil-filled electrical device 1 (step S13).

Thereafter, using AC source 11, an AC voltage is applied between paper-covered copper wires 5A and 5B in tank 3 (step S14).

Next, using ammeter 12, the current flowing across paper-covered copper wires 5A and 5B in tank 3 is measured (step S15).

Next, based on the result of current measurement, the state of sulfide generation in oil-filled electrical device 1 is examined and analyzed (step S16).

In this manner, in apparatus 102 for analyzing the state of oil-filled electrical device, AC voltage is applied between the paper-covered copper wires and the AC current flowing across the paper-covered copper wires is constantly monitored. Since the current flowing across paper-covered copper wires 5A and 5B is measured, it is possible to measure an amount that corresponds to the electrostatic capacitance between paper-covered copper wires 5A and 5B. By such a configuration, it is possible to detect the change in electrostatic capacitance between paper-covered copper wires 5A and 5B by the simple configuration and method as compared with the apparatus for analyzing the state of oil-filled electrical device in accordance with the first embodiment.

Third Embodiment

The present embodiment relates to an apparatus for analyzing the state of oil-filled electrical device in which the configuration of electrodes is changed from those in the apparatuses for analyzing the state of oil-filled electrical device in accordance with the first and second embodiments. Except for the points described in the following, the apparatus is the same as the apparatuses for analyzing the state of oil-filled electrical devices in accordance with the first and second embodiments.

Figure 10:
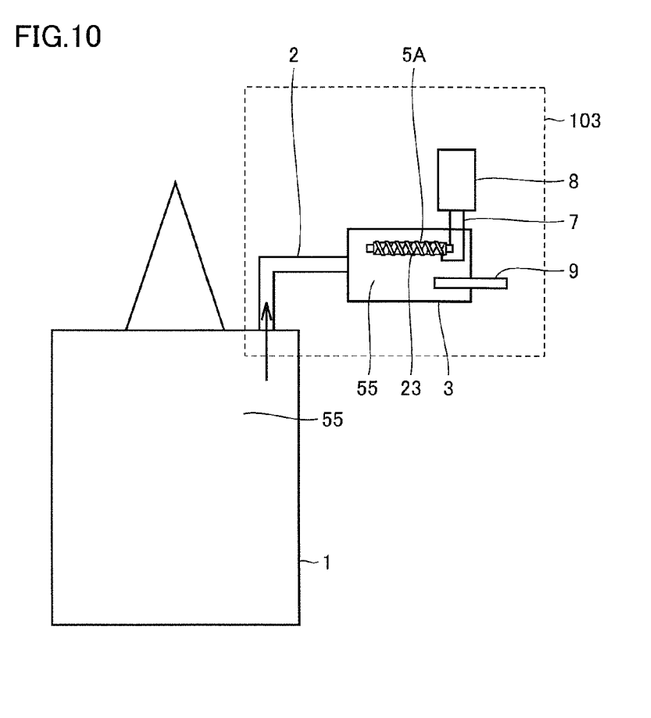
FIG. 10 shows a configuration of an apparatus for analyzing state of oil-filled electrical device in accordance with a third embodiment of the present invention.

FIG. 10 shows a configuration of an apparatus for analyzing state of oil-filled electrical device in accordance with the third embodiment of the present invention.

Referring to FIG. 10, an apparatus 103 for analyzing the state of oil-filled electrical device includes pipe 2, tank 3, paper-covered copper wire 5A, a metal foil 23, measuring line 7, capacitance measuring instrument (capacitance measuring unit) 8, and oil temperature regulator (temperature regulating unit) 9.

Figure 11:
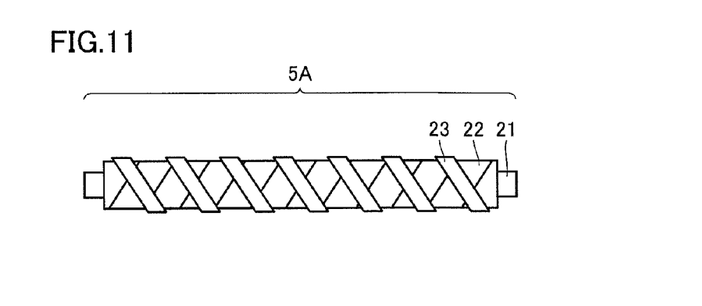
FIG. 11 shows a structure of an electrode used in the apparatus for analyzing state of oil-filled electrical device in accordance with the third embodiment of the present invention.

FIG. 11 shows a structure of an electrode used in the apparatus for analyzing state of oil-filled electrical device in accordance with the third embodiment of the present invention. Referring to FIGS. 10 and 11, paper-covered copper wire 5A includes copper wire 21 and insulating paper 22. Metal foil 23 is arranged on a surface of insulating paper such that part of the surface of insulating paper 22 is in contact with insulating oil 55. Therefore, paper-covered copper wire 5A and electrode 23 are provided adjacent to each other. Specifically, metal foil 23 is wrapped around paper-covered copper wire 5A to expose part of the surface of insulating paper 22 and in tight contact with the surface of insulating paper 22. In other words, metal foil 23 is wrapped around paper-covered copper wire 5A to leave some gaps.

In the third embodiment, paper-covered copper wire 5A simulates coil 53 of oil-filled electrical device 1 that is in operation, and metal foil 23 is used as a counter electrode of paper-covered copper wire 5A. In the first and second embodiments, paper-covered copper wire 5B is used as the counter electrode of paper-covered copper wire 5A. Specifically, in the third embodiment, paper-covered copper wire 5A used in the first and second embodiments may be directly used. In the third embodiment, metal foil 23 is used as the electrode, in place of paper-covered copper wire 5B.

As shown in FIG. 10, in the third embodiment, measuring line 7 is drawn out from each of metal foil 23 and copper wire 21 of paper-covered copper wire 5A. Capacitance measuring instrument 8 measures the electrostatic capacitance between paper-covered copper wire 5A and metal foil 23 through measuring line 7.

Figure 12:
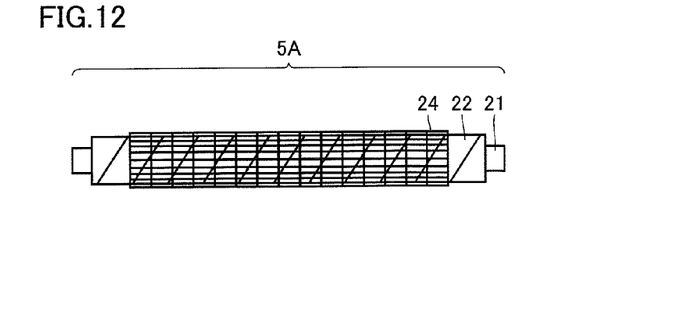
FIG. 12 shows another structure of the electrode used in the apparatus for analyzing state of oil-filled electrical device in accordance with the third embodiment of the present invention.

It is noted that the electrode arranged on the surface of insulating paper such that part of the surface of insulating paper 22 is in contact with insulating oil 55 is not limited to metal foil 23 shown in FIGS. 10 and 11. By way of example, an electrode formed to have a net-like shape such as shown in FIG. 12 may be used in place of metal foil 23.

The operation procedure for diagnosing an oil-filled electrical device using apparatus 103 for analyzing the state of oil-filled electrical device shown in FIG. 10 is the same as the procedure shown in FIG. 4. In the third embodiment, electrostatic capacitance between paper-covered copper wire 5A and metal foil 23 is measured in accordance with the procedure shown in FIG. 4.

Next, the fact that the generation of sulfide in oil-filled electrical device 1 can be simulated by the apparatus for analyzing the state of oil-filled electrical device in accordance with the third embodiment will be described. It is considered that sulfide is generated on insulating paper through the following process including two stages. At the first stage, specific component containing sulfur in the insulating oil reacts with copper in copper wire 21, resulting in formation of a complex. The complex elutes to the insulating oil. At the second stage, sulfur eluted to the insulating oil and the complex having copper component are absorbed in the insulating paper and, thereafter, the complex is decomposed. As the complex is decomposed, copper sulfide is precipitated on the insulating paper. Therefore, if it is possible to simulate the complex forming reaction of the insulating oil and copper of the coil conductor and the reaction of the complex eluted to the insulating oil and absorbed in the insulating film, forming the copper sulfide, by the apparatus for analyzing the state of oil-filled electrical device, it is possible to simulate formation of copper sulfide in the oil-filled electrical device.

As shown in FIG. 11, in the present embodiment, metal foil 23 is wrapped around paper-covered copper wire 5A such that part of the surface of insulating paper 22 is exposed. By making wider the exposed portion of insulating paper 22, the complex forming reaction between copper wire 21 and the insulating oil that permeated through insulating paper 22 can be simulated.

Figure 13:
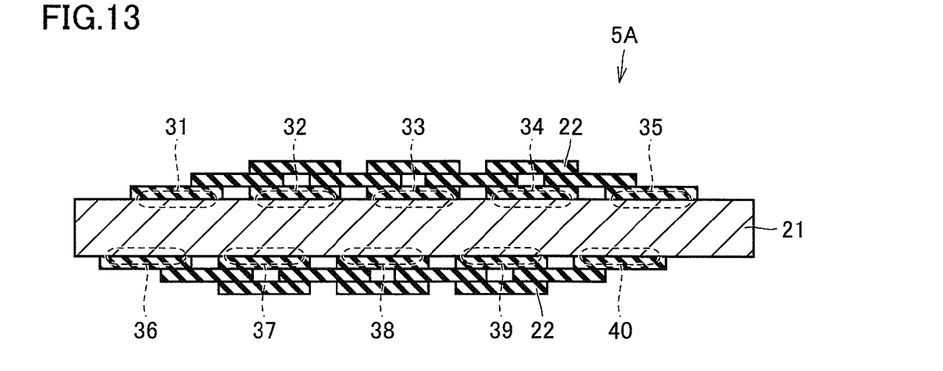
FIG. 13 is a schematic cross-sectional view showing portions where copper sulfide is precipitated on the insulating paper.

FIG. 13 is a schematic cross-sectional view showing portions where copper sulfide is precipitated on the insulating paper.

Referring to FIG. 13, the complex having the copper component and sulfur eluted to the insulating oil is absorbed in insulating paper 22 and then forms copper sulfide. Therefore, generally, copper sulfide is formed first at a surface (regions 31 to 40 shown in FIG. 13) of insulating paper 22 adjacent to copper wire 21. Therefore, by wrapping metal foil 23 around paper-covered copper wire 5A such that part of the surface of insulating paper 22 is exposed, generation of copper sulfide in oil-filled electrical device 1 can be simulated.

According to the present embodiment, the opposed area between the two electrodes can be made larger than when two paper-covered conductors are placed opposite to each other. Therefore, electrostatic capacitance can be made larger than in the first and second embodiments. For this reason, according to the third embodiment, increase in electrostatic capacitance resulting from the generation of copper sulfide can be detected with higher sensitivity. Since the increase in electrostatic capacitance is detected with high sensitivity, it becomes possible to detect generation of copper sulfide on the paper-covered copper wire before the insulating characteristic starts to lower.

Figure 14:
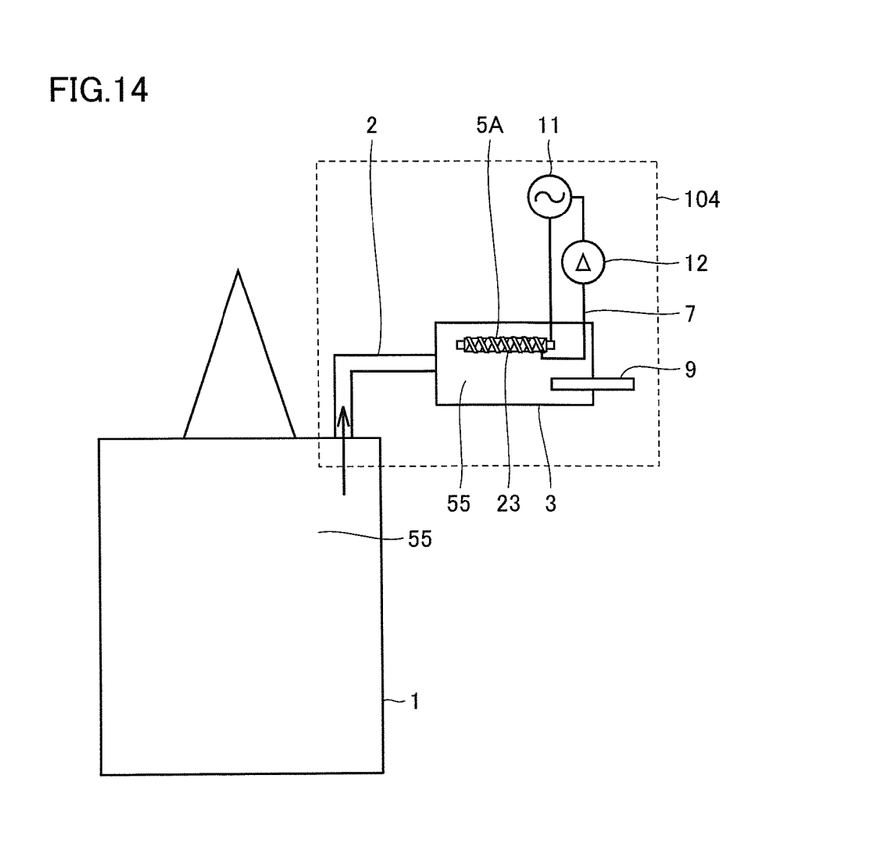
FIG. 14 shows another configuration of the apparatus for analyzing state of oil-filled electrical device in accordance with the third embodiment of the present invention.

The electrode shown in FIG. 11 may be used in the apparatus for analyzing the state of oil-filled electrical device in accordance with the second embodiment of the present invention. FIG. 14 shows another configuration of the apparatus for analyzing the state of oil-filled electrical device in accordance with the third embodiment of the present invention.

Referring to FIG. 14, an apparatus 104 for analyzing the state of oil-filled electrical device includes pipe 2, tank 3, paper-covered copper wire 5A, metal foil 23, measuring line 7, AC source 11, and ammeter (current measuring unit) 12. AC source 11 applies an AC voltage across paper-covered copper wire 5A and metal foil 23. Ammeter 12 measures the current flowing across paper-covered copper wire 5A and metal foil 23.

The operation procedure for diagnosing an oil-filled electrical device using apparatus 104 for analyzing the state of oil-filled electrical device shown in FIG. 14 is the same as the procedure shown in FIG. 9. In apparatus 104 for analyzing the state of oil-filled electrical device, an AC voltage is applied between paper-covered copper wire 5A and metal foil 23, and the AC current flowing across two electrodes (copper wire 21 and metal foil 23) is constantly monitored. By measuring the current flowing across the two electrodes, it is possible to measure the amount proportional to the electrostatic capacitance between the two electrodes. In the configuration shown in FIG. 11, the electrostatic capacitance can be increased as the opposed area between the two electrodes is made larger. Thus, it is possible to measure the amount in proportion to the electrostatic capacitance between paper-covered copper wires 5A and 5B.

In apparatus 104 for analyzing the state of oil-filled electrical device shown in FIG. 14, electrode 24 shown in FIG. 12 may be used in place of electrode 23 shown in FIG. 11.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

REFERENCE SIGNS LIST 1 oil-filled electrical device, 2 pipe, 3 tank, 5A, 5B paper-covered copper wires, 7 measuring line, 8 capacitance measuring instrument (capacitance measuring unit), 9 oil temperature regulator (oil temperature regulating unit), 11 AC source, 12 ammeter (current measuring unit), 21 copper wire, 22 insulating paper, 23 metal foil, 24 electrode, 31-40 regions, 51, 52 iron cores, 53 coil, 54 cooler, 55 insulating oil, 56 pump, 101, 102, 103, 104 apparatuses for analyzing the state of oil-filled electrical device.

The invention claimed is:

1. An apparatus for analyzing a state of an oil-filled electrical device, simulating a state of an oil-filled electrical device having a copper wire wrapped with insulating paper immersed in insulating oil, comprising:
a first paper-covered copper wire including a first copper wire and first insulating paper wrapped around said first copper wire, said first insulating paper being formed of the same material as the insulating paper held in said oil-filled electrical device;
an electrode arranged adjacent to said first paper-covered copper wire;
a tank containing said first paper-covered copper wire, said electrode and insulating oil extracted from said oil-filled electrical device, so that said first paper-covered copper wire and said electrode are immersed in said insulating oil extracted from said oil-filled electrical device; and
a capacitance measuring unit for measuring electrostatic capacitance between said first paper-covered copper wire and said electrode.

2. The apparatus for analyzing a state of an oil-filled electrical device according to claim 1, further comprising
a pipe connecting said oil-filled electrical device to said tank for extracting said insulating oil from said oil-filled electrical device.

3. The apparatus for analyzing a state of an oil-filled electrical device according to claim 1, further comprising
a temperature regulating unit for heating said insulating oil contained in said tank.

4. The apparatus for analyzing a state of an oil-filled electrical device according to claim 1, wherein
said electrode includes a second paper-covered copper wire including a second copper wire and second insulating paper wrapped around said second copper wire; and
said second insulating paper is formed of the same material as the insulating paper held in said oil-filled electrical device.

5. The apparatus for analyzing a state of an oil-filled electrical device according to claim 1, wherein
said electrode is arranged on a surface of said insulating paper such that part of said surface of said first insulating paper is in contact with said insulating oil.

6. An apparatus for analyzing a state of an oil-filled electrical device, simulating a state of an oil-filled electrical device having a copper wire wrapped with insulating paper immersed in insulating oil, comprising:

a first paper-covered copper wire including a first copper wire and first insulating paper wrapped around said first copper wire, said first insulating paper being formed of the same material as the insulating paper held in said oil-filled electrical device;

an electrode arranged adjacent to said first paper-covered copper wire;

a tank containing said first paper-covered copper wire, said electrode and insulating oil extracted from said oil-filled electrical device, so that said first paper-covered copper wire and said electrode are immersed in said insulating oil extracted from said oil-filled electrical device;

a power source (11) for applying an AC voltage across said first paper-covered copper wire and said electrode; and a current measuring unit (12) for measuring a current flowing across said first paper-covered copper wire and said electrode.

7. The apparatus for analyzing a state of an oil-filled electrical device according to claim 6, further comprising a pipe connecting said oil-filled electrical device to said tank for extracting said insulating oil from said oil-filled electrical device.

8. The apparatus for analyzing a state of an oil-filled electrical device according to claim 6, further comprising a temperature regulating unit for heating said insulating oil contained in said tank.

9. A method of analyzing a state of an oil-filled electrical device simulating a state of an oil-filled electrical device having a copper wire wrapped with insulating paper immersed in insulating oil, comprising the step of putting insulating oil extracted from said oil-filled electrical device, a first paper-covered copper wire including a first copper wire and first insulating paper wrapped around said first copper wire, and an electrode arranged adjacent to said first paper-covered copper wire in a tank, such that said first paper-covered copper wire and said electrode are immersed in said insulating oil, wherein said first insulating paper is formed of the same material as the insulating paper held in said oil-filled electrical device; and measuring electrostatic capacitance between said first paper-covered copper wire and said electrode contained in said tank.

10. The method of analyzing a state of an oil-filled electrical device according to claim 9, wherein at said step of putting said insulating oil, said first copper wire and said electrode in said tank, said insulating oil is extracted through a pipe connecting said oil-filled electrical device to said tank.

11. The method of analyzing a state of an oil-filled electrical device according to claim 9, further comprising the step of heating said insulating oil contained in said tank; wherein at said step of measuring the electrostatic capacitance, electrostatic capacitance between said first paper-covered copper wire and said electrode immersed in the heated insulating oil is measured.

12. The method of analyzing a state of an oil-filled electrical device according to claim 9, wherein said electrode includes a second paper-covered copper wire including a second copper wire and second insulating paper wrapped around said second copper wire; and said second insulating paper is formed of the same material as the insulating paper held in said oil-filled electrical device.

13. The method of analyzing a state of an oil-filled electrical device according to claim 9, wherein said electrode is arranged on a surface of said insulating paper such that part of said surface of said first insulating paper is in contact with said insulating oil.

14. A method of analyzing a state of an oil-filled electrical device simulating a state of an oil-filled electrical device having a copper wire wrapped with insulating paper immersed in insulating oil, comprising the step of putting insulating oil extracted from said oil-filled electrical device, a first paper-covered copper wire including a first copper wire and first insulating paper wrapped around said first copper wire, and an electrode arranged adjacent to said first paper-covered copper wire in a tank, such that said first paper-covered copper wire and said electrode are immersed in said insulating oil, wherein said first insulating paper is formed of the same material as the insulating paper held in said oil-filled electrical device; and measuring a current flowing across said first paper-covered copper wire and said electrode by applying an AC voltage across said first paper-covered copper wire and said electrode contained in said tank.

15. The method of analyzing a state of an oil-filled electrical device according to claim 14, wherein at said step of putting said insulating oil, said first copper wire and said electrode in said tank, said insulating oil is extracted through a pipe connecting said oil-filled electrical device to said tank.

16. The method of analyzing a state of an oil-filled electrical device according to claim 14, further comprising the step of heating said insulating oil contained in said tank; wherein at said step of measuring the current, an AC voltage is applied across said first paper-covered copper wire and said electrode immersed in the heated insulating oil and whereby said current is measured.

\* \* \* \* \*